United States Patent
Standing et al.

(10) Patent No.: US 9,852,940 B2
(45) Date of Patent: Dec. 26, 2017

(54) METHOD FOR FORMING A RELIABLE SOLDERABLE CONTACT

(71) Applicant: Infineon Technologies Americas Corp., El Segundo, CA (US)

(72) Inventors: Martin Standing, Tonbridge (GB); Andrew Sawle, East Grinstead (GB); Matthew P. Elwin, Sketty (GB); David P. Jones, Penarth (GB); Martin Carroll, Canton (GB); Ian Glenville Wagstaffe, Newport (GB)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 13/756,427

(22) Filed: Jan. 31, 2013

(65) Prior Publication Data
US 2013/0143399 A1 Jun. 6, 2013

Related U.S. Application Data

(62) Division of application No. 10/982,965, filed on Nov. 5, 2004, now Pat. No. 8,368,211.
(Continued)

(51) Int. Cl.
*H01L 21/768* (2006.01)
*H01L 23/31* (2006.01)
(Continued)

(52) U.S. Cl.
CPC ...... *H01L 21/76829* (2013.01); *H01L 23/498* (2013.01); *H01L 24/05* (2013.01); *H01L 23/3171* (2013.01); *H01L 24/81* (2013.01); *H01L 24/83* (2013.01); *H01L 2224/0401* (2013.01); *H01L 2224/05082* (2013.01); *H01L 2224/05155* (2013.01); *H01L 2224/05166* (2013.01); *H01L 2224/05568* (2013.01); *H01L 2224/05572* (2013.01); *H01L 2224/05573* (2013.01); *H01L 2224/05639* (2013.01); *H01L 2224/81801* (2013.01); *H01L 2224/83801* (2013.01); *H01L 2924/0002* (2013.01); *H01L 2924/00014* (2013.01); *H01L 2924/014* (2013.01); *H01L 2924/01005* (2013.01); *H01L 2924/01006* (2013.01);
(Continued)

(58) Field of Classification Search
CPC . H01L 2224/05639; H01L 2924/01047; H01L 2924/014
USPC .................................................. 438/612–614
See application file for complete search history.

(56) References Cited

U.S. PATENT DOCUMENTS

| | | |
|---|---|---|
| 5,943,597 A | 8/1999 | Kleffner et al. |
| 6,028,011 A | 2/2000 | Takase et al. |

(Continued)

OTHER PUBLICATIONS

Prosecution History from U.S. Appl. No. 13/754,822, dated Aug. 22, 2013 through Aug. 2, 2016, 163 pp.
(Continued)

*Primary Examiner* — Marvin Payen
*Assistant Examiner* — Vernon P Webb
(74) *Attorney, Agent, or Firm* — Shumaker & Sieffert, P.A.

(57) ABSTRACT

A silver-containing solderable contact on a semiconductor die has its outer edge spaced from the confronting edge of an epoxy passivation layer so that, after soldering, silver ions are not present and are not therefor free to migrate under the epoxy layer to form dendrites.

18 Claims, 1 Drawing Sheet

Related U.S. Application Data

(60) Provisional application No. 60/552,139, filed on Mar. 11, 2004.

(51) Int. Cl.
*H01L 23/00* (2006.01)
*H01L 23/498* (2006.01)

(52) U.S. Cl.
CPC .............. *H01L 2924/01013* (2013.01); *H01L 2924/01047* (2013.01); *H01L 2924/01077* (2013.01); *H01L 2924/1033* (2013.01); *H01L 2924/10253* (2013.01); *H01L 2924/10272* (2013.01); *H01L 2924/1306* (2013.01); *H01L 2924/13091* (2013.01)

(56) References Cited

U.S. PATENT DOCUMENTS

| | | | |
|---|---|---|---|
| 6,165,885 A * | 12/2000 | Gaynes | B23K 1/0016 257/737 |
| 6,570,251 B1 | 5/2003 | Akram et al. | |
| 6,624,522 B2 | 9/2003 | Standing et al. | |
| 7,057,255 B2 | 6/2006 | Yamabayashi et al. | |
| 8,368,211 B2 | 2/2013 | Standing et al. | |
| 2004/0160727 A1* | 8/2004 | Marcoux et al. | 361/306.1 |
| 2004/0188851 A1* | 9/2004 | Takewaki et al. | H01L 21/76849 257/774 |
| 2013/0140701 A1 | 6/2013 | Standing et al. | |

OTHER PUBLICATIONS

Prosecution History from U.S. Appl. No. 10/982,965, from Feb. 9, 2006 through Oct. 3, 2012, 217 pp.
Response to Office Action dated Aug. 2, 2016, from U.S. Appl. No. 13/754,822, filed Oct. 25, 2016, 9 pp.
Final Rejection from U.S. Appl. No. 13/754,822, dated Jun. 19, 2017, 7 pp.
Response to Final Rejection dated Jun. 19, 2017 from U.S. Appl. No. 13/754,822, filed Aug. 1, 2017, 6 pp.
Notice of Allowance from U.S. Appl. No. 13/754,822, dated Aug. 25, 2017, 7 pp.

* cited by examiner

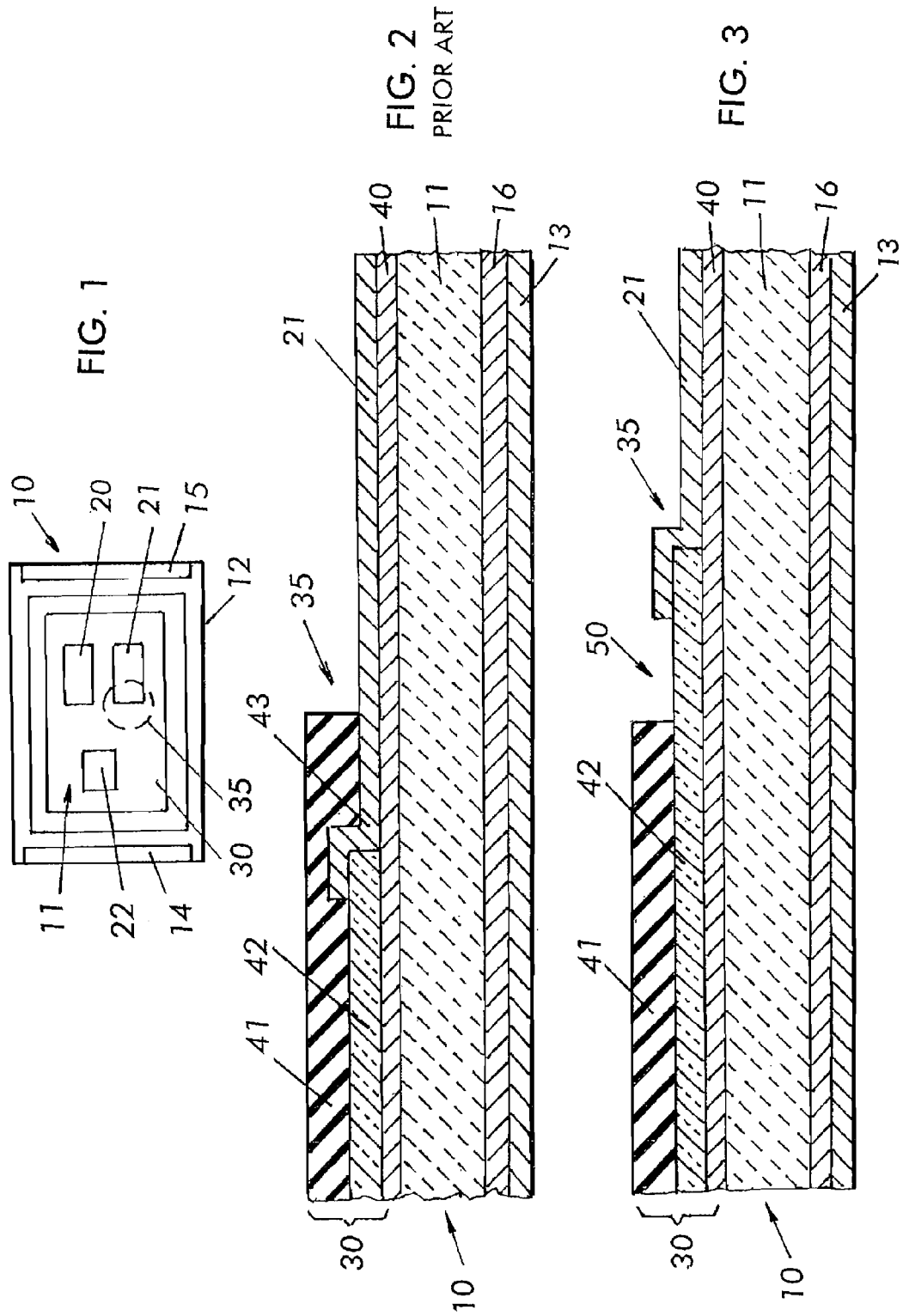

ured silver-containing alloys deposited on aluminum die electrodes, which are insulated from other surfaces by an insulation passivation coating which overlaps the edges of the contact area.

METHOD FOR FORMING A RELIABLE SOLDERABLE CONTACT

RELATED APPLICATIONS

This is a divsional of application Ser. No. 10/982,965 filed 11/5/2004.

This application claims the benefit of U.S. Provisional Application No. 60/552,139, filed Mar. 11, 2004.

FIELD OF THE INVENTION

This invention relates to semiconductor devices and processes for their manufacture and more specifically relates to a novel solderable contact structure for semiconductor die.

BACKGROUND OF THE INVENTION

Solderable contacts for semiconductor devices are well known. Such contact structures are commonly silver-containing alloys deposited on aluminum die electrodes, which are insulated from other surfaces by an insulation passivation coating which overlaps the edges of the contact area.

It has been found that the silver ions from the top metal layer will migrate under the passivation layer and form dendrites under prolonged exposure to electric fields and moisture. Thus, over time, the dendrites will form conductive bridges between device electrodes and device terminations, thus reducing device reliability.

It would be desireable to provide a passivated top silver-containing solderable contact in which the migration of silver from device electrodes and under the passivation is prevented.

BRIEF DESCRIPTION OF THE INVENTION

In accordance with the invention the silver-containing solderable metal layer is terminated around its periphery and is spaced from the edge an epoxy passivation layer, forming a gap between the edge of the epoxy passivation and the confronting edge of the solderable metal layer. During solder attach of the device to a circuit board or the like, the attach-solder will dissolve the exposed silver, forming a solder alloy. This prevents the migration of silver ions from the solderable electrodes to the termination during applied electric fields to the device during its operation. Thus, dendrite formation is reduced and device reliability is improved.

The novel invention has application to any semiconductor device in which a solderable contact is desired, such as the Direct FET® device of International Rectifier as shown, for example, in U.S. Pat. No. 6,624,522, issued Sep. 23, 2003, entitled CHIP SCALE SURFACE MOUNTED DEVICE AND PROCESS OF MANUFACTURE (IR-1830), as well as to flip chips; humped/wafer level packages and the like.

BRIEF DESCRIPTION OF THE DRAWINGS

FIG. 1 is a bottom view of a Direct FET® type package of the type shown in aforementioned U.S. Pat. No. 6,624,522.

FIG. 2 is a cross-section of the circled portion of FIG. 1, showing the area of overlap of a passivation layer and solderable metal of the prior art.

FIG. 3 is a cross-section like that of 2, but illustrating the novel invention in which the edge of the solderable metal is spaced from the confronting edge of the epoxy passivation.

DETAILED DESCRIPTION OF THE DRAWINGS

Referring first to FIGS. 1 and 2 there is shown a bottom view of a Direct FET® type package 10 in which a MOSFET semiconductor die 11 is contained within a metal can 12 which has an open bottom, shown in Figure, and a top web 13, shown in FIGS. 2 and 3. The web 13 is connected to flanges 14 and 15 which form a contact for drain electrode 16 on the bottom surface of die 11.

The top surface of die 11 is exposed by the open bottom of conductive can 12 and contains a source electrode having solderable contacts 20 and 21 and a solderable gate contact 22. The top surfaces of contacts 20, 21 and 22 are generally coplanar with drain contacts 14, 15 although there could be an upset of up to about 50 μm an due to tolerance variations. Thus, the device is solderable at its contacts 14, 15, 20, 21 and 22 to respective corresponding contact areas on a flat circuit board (not shown). The contacts 20, 21 and 22 are insulated from one another and from the conventional termination enclosing the upper surface of die 11 by an insulation passivation layer 30.

It is to be noted that the invention is illustrated as applied to a Direct FET® type device. However, the die 11 may be any semiconductor die which has a solderable contact which is insulated by a surrounding passivation coating.

In the device illustrated, the die 10 (shown as silicon, but which may be of other materials, for example, SiC, GaN, and the like) has the contact structure shown in cross-section in FIG. 2, which is a section through the surface area shown in the circle 35 in FIG. 1. Thus solderable contact 21 is the exposed area of a silver-containing solderable metal such as a conventional titanium/nickel/silver stack having thicknesses of 1,000 Å, 2000 Å and 6000 Å respectively, which is deposited atop the aluminum source contact 40 of MOSFET die 11. The solderable contact 21 is surrounded by insulation passivation layer 30 which consists of a nitride layer 42 and an epoxy layer 41. Note that the edge of contact 21 overlaps nitride layer 42 and is encapsulated under the epoxy layer 41. Thus, the outer rim area 43 of contact 21, is captured under epoxy 41 and is not exposed to solder during a soldering operation. The epoxy layer 41 may also be formed of BCB, polyamide or polysiloxane passivation materials.

In the structure of FIG. 2, and after soldering to the exposed area of contact 21, free silver ions can migrate from top metal 21, under the insulation epoxy layer and form dendrites under prolonged exposure to electric fields and moisture during operation. These dendrites can form conductive bridges to and toward the die terminations, thus impacting device reliability.

In accordance with the invention, and as shown in FIG. 3, the edge of metallizing 21 is foreshortened to overlie nitride layer 42, but spaced from the confronting edge of epoxy layer 41, creating the gap 50 there between. The gap 50 will preferably surround the periphery of contact 21 in FIG. 1. Significantly, the outer rim of contact 21 is fully exposed for solder connection.

When the device of FIG. 3 is to be attached by soldering to a circuit board, the attach solder dissolves the exposed silver containing contact 21, forming a solder alloy in the conventional manner. This takes place when using any conventional solder. The silver is now fully captured within the alloy and cannot migrate from the device electrodes to create dendrites and reduce device reliability. Note that in the prior art device that the silver-containing solderable contact 21 captured under the epoxy layer 42 is not reached during soldering and the remaining silver is a source of the migrating ions which will form the disadvantageous dendrites.

To form gap 50, the nitride layer 42 was extended by about 35 microns, as compared to FIG. 2; and the gap 50 is about 10 microns and can be from about 5 microns to about 20 microns wide. More generally, the gap should be at least as wide as needed to insure that no silver is encapsulated under epoxy 41, and all of the silver contact 21 is exposed to alloying during soldering.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A method comprising:
    forming a conductive layer in a semiconductor die;
    forming a dielectric layer over said conductive layer;
    forming an epoxy layer over said dielectric layer; and
    forming an electrically connected solderable contact that is exposed and solderable and that includes a first portion disposed over and electrically connected to said conductive layer, and a second portion disposed over a portion of said dielectric layer, said electrically connected solderable contact comprising silver;
    wherein a gap separates an edge surface of said second portion of said electrically connected solderable contact from an edge surface of said epoxy layer, such that said electrically connected solderable contact does not contact said epoxy layer, and wherein said edge surface of said second portion has an area less than an area of said edge surface of said epoxy layer.

2. The method of claim 1, wherein said electrically connected solderable contact further comprises a titanium-containing layer.

3. The method of claim 1, wherein said electrically connected solderable contact further comprises a nickel-containing layer.

4. The method of claim 1, wherein said conductive layer is a contact layer in said semiconductor die.

5. The method of claim 4, wherein said contact layer comprises aluminum.

6. The method of claim 4, wherein said contact layer provides contact to a source of a MOSFET in said semiconductor die.

7. The method of claim 1, wherein said dielectric layer comprises a nitride layer.

8. The method of claim 1, wherein said electrically connected solderable contact is a stack comprising a silver-containing layer, a titanium-containing layer, and a nickel-containing layer.

9. The method of claim 1, wherein said epoxy layer comprises a material selected from the group consisting of BCB, polyamide, and polysiloxane.

10. A method comprising:
    forming a conductive layer in a semiconductor die;
    forming a dielectric layer over said conductive layer;
    forming an electrically connected solderable contact having a first portion disposed over and electrically connected to said conductive layer, and a second portion disposed over said dielectric layer, wherein said first and second portions are exposed for soldering; and
    forming an epoxy layer over said dielectric layer at a position that is offset from said second portion of said electrically connected solderable contact so that a gap separates said epoxy layer from said electrically connected solderable contact, wherein a thickness of said epoxy layer is greater than a thickness of said second portion of said electrically connected solderable contact.

11. The method of claim 10, wherein said electrically connected solderable contact comprises silver.

12. The method of claim 11, wherein said silver is prevented from ion migration.

13. The method of claim 11, wherein said silver does not form dendrites.

14. The method of claim 10, wherein said electrically connected solderable contact comprises titanium.

15. The method of claim 10, wherein said electrically connected solderable contact comprises nickel.

16. The method of claim 10, wherein said conductive layer is a contact layer in said semiconductor die.

17. The method of claim 16, wherein said contact layer comprises aluminum.

18. The method of claim 16, wherein said contact layer provides contact to a source of a MOSFET in said semiconductor die.

* * * * *